United States Patent
Fujimoto et al.

[11] Patent Number: 5,978,218
[45] Date of Patent: *Nov. 2, 1999

[54] COOLING SYSTEM FOR IC TESTER

[75] Inventors: Akihiro Fujimoto, Gunman-ken; Jun Midorikawa, Gyoda, both of Japan

[73] Assignee: Advantest Corp., Tokyo, Japan

[*] Notice: This patent is subject to a terminal disclaimer.

[21] Appl. No.: 08/929,851

[22] Filed: Sep. 15, 1997

Related U.S. Application Data

[63] Continuation-in-part of application No. 08/562,071, Nov. 22, 1995, abandoned.

[30] Foreign Application Priority Data

Nov. 24, 1994 [JP] Japan ................................... 6-314191

[51] Int. Cl.[6] ....................................................... H05K 7/20
[52] U.S. Cl. ..................... 361/696; 165/80.3; 324/158.1; 454/184
[58] Field of Search ................................ 324/158.1, 760, 324/765; 62/259.2, 208; 361/696, 694, 695, 702, 714, 701, 717, 719, 687; 454/184; 165/80.3, 80.4, 122–126

[56] References Cited

U.S. PATENT DOCUMENTS

| | | | |
|---|---|---|---|
| 4,514,746 | 4/1985 | Lundgvist | 361/385 |
| 4,600,050 | 7/1986 | Noren | 361/384 |
| 5,150,277 | 9/1992 | Bainbridge | 361/384 |
| 5,251,097 | 10/1993 | Simmons | 361/687 |
| 5,414,591 | 5/1995 | Kimura | 361/695 |
| 5,422,787 | 6/1995 | Gourdine . | |
| 5,644,248 | 7/1997 | Fujimoto . | |
| 5,663,868 | 9/1997 | Stalley . | |
| 5,767,690 | 6/1998 | Fujimoto . | |
| 5,793,610 | 8/1998 | Schmitt . | |
| 5,805,566 | 9/1998 | Porter . | |
| 5,813,243 | 9/1998 | Johnson . | |
| 5,825,621 | 10/1998 | Giannatto . | |
| 5,835,349 | 11/1998 | Giannatto . | |

FOREIGN PATENT DOCUMENTS 6-125187  5/1994  Japan .

*Primary Examiner*—Gerald Tolin
*Attorney, Agent, or Firm*—Muramatsu & Associates

[57] ABSTRACT

A cooling system for an IC tester achieves an optimum temperature control in a sealed box type housing. The cooling system includes a sealed housing, a board rack for mounting a plurality of circuit boards horizontally, a back board mounted perpendicular to the floor of the sealed housing for controlling the air flow around the circuit boards wherein the back board is positioned at around the center of the sealed housing in such a way that a continuous air flow passage is formed between the back board and inner walls of the sealed housing so that the air flows circulate around the back board, a cooling tube connected to a heat exchanger in order to circulate cooling medium, a plurality of small sized fans forming a horizontal air passage between the heat exchanger and the boards within the sealed housing so that the temperature difference among the boards is minimized.

5 Claims, 4 Drawing Sheets

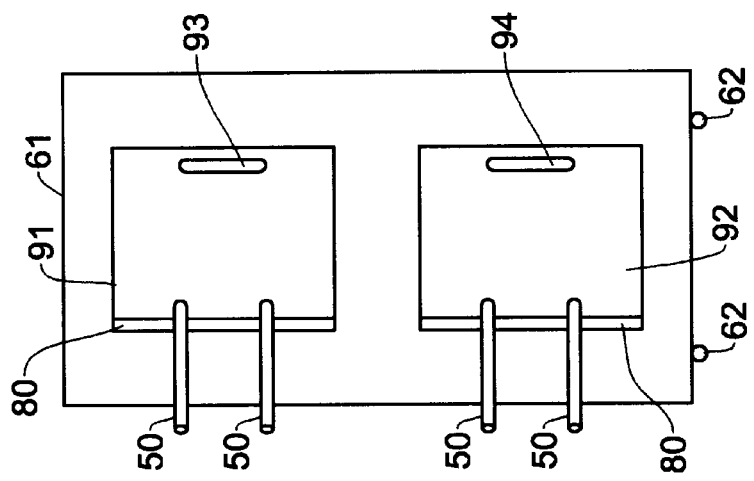
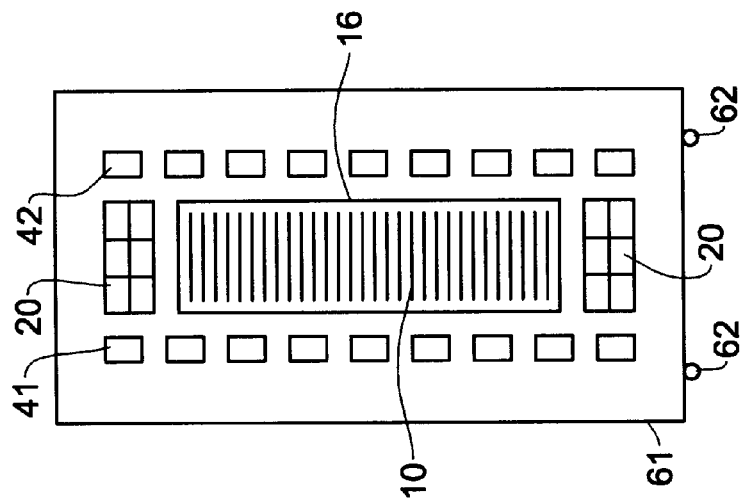
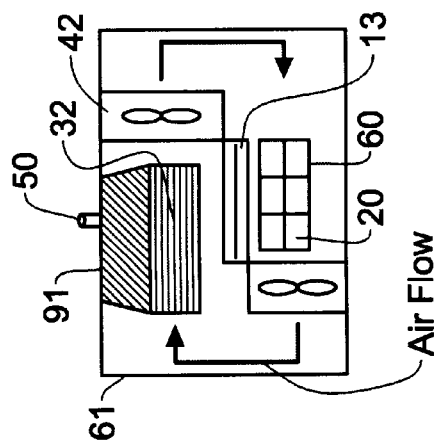

5,978,218

COOLING SYSTEM FOR IC TESTER

This is a continuation-in-part of U.S. patent application Ser. No. 08/562,071, filed Nov. 22, 1995, now abandoned.

FIELD OF THE INVENTION

This invention relates to a sealed box type cooling system for an IC tester, and more particularly, to a cooling system forming a plurality of horizontal air flow layers in a housing of the IC tester.

BACKGROUND OF THE INVENTION

Most of the conventional box-type cooling systems incorporated in IC testers (hereinafter tester(s)) employ fans which are provided in a box like housing, wherein heat generated by an electric system of the tester is cooled by air flows generated by the fans.

In such a conventional technology, it is arranged that the fans mounted in the housing are propelled to take air into the electric system in the tester and the heated air is expelled from the housing to the room where the tester is located. However, this cooling system is disadvantageous because the room temperature where the tester is located increases as the number of the testers increases.

Therefore, in another conventional technology, a sealed box type cooling system is provided in the tester in order to solve the above problem. In this example, it is designed to control the temperature within the tester by sealing the housing and having a heat exchanger, a cooling device, and a fan therein. The fan sends air to the electric system in the housing. The cooled air passes through the heat exchanger while circulating within the sealed housing to control the temperature within the sealed housing. Therefore, this sealed housing type cooling system is more advantageous than the other cooling system which releases the heated air into the room where the tester is located. Furthermore, the sealed housing type cooling system is easier to control the temperature within the tester.

Such a conventional sealed housing type cooling system is shown in a plan view of FIG. 4A, a front view of FIG. 4B, and a left side view of FIG. 4C, respectively.

The conventional technology is explained in the following with reference to FIGS. 4A–4C. In a sealed housing 60, it is arranged that: boards 10 in which electric components are mounted are arranged on a board rack 15 in two layers; a power source unit 20 is arranged at the side position of the board rack 15; and heat exchangers 30 and 31 connected to a cooling tube 50 are provided in the lower side of the board rack 15 and the power source unit 20.

Cooling medium whose temperature is controlled circulates in the cooling tube 50. Because the boards 10 are provided in two layers in a vertical direction, plural fans 40 provided in the sealed housing 60 have to be large in order to generate sufficient air flows for the two layers. Thus, the size of the sealed housing 60 is adversely affected by the size of the plural fans 40 in that there arises a large dead space in the sealed housing 60.

Casters 62 are provided at the bottom of the sealed housing 60 for a precise adjustment of the tester position. In this conventional cooling system, since the housing is tightly sealed, the noise of the large fans 40 is not a major problem. The cooling system provides a dust free environment since the outside air never enters the tester except when the tester is opened for the repair and maintenance. The heated air will not escape from the housing because the heat generated by the electric system is transferred to the cooling medium. However, since the boards 10 are provided in two layers, a problem of temperature differences is occurred between the upper layer and the lower layer, which affects the performance of the boards 10 having high density electric components.

In other words, since the board rack 15 storing the boards 10 therein are provided in two layers, there arises a problem of difference in the cooling conditions between the upper and lower levels of the rack 15. In this structure of the conventional technology, since the cool air is sent from the lower to the upper direction, the air will be heated when it passes through the lower board 10 before coming to the upper board 10 and is further heated by the upper board 10. As a result, the temperature in the upper board is, for example, 5° C. higher than the lower board. This temperature difference may deteriorate the operation of the VLSI (Very Large Scale Integrated) circuits and other electric components which are mounted on the boards 10.

Furthermore, the length of the air flow route in the sealed housing is quite large, which is about 5 meters, resulting in the temperature difference in the route. In order to solve this problem, the large sized fans 40 are provided in the housing. However, it still has a problem because as the size of the fans increases, the size of the sealed housing also increases. In addition, since the entire housing itself is intended to function as an air duct without employing a separate air duct therein, even though the housing would be tightly sealed, air often leaks.

Moreover, the conventional technology is further involved a problem in that an input/output side for connection of electric signals can be accommodated in only one side of the sealed housing due to the structural limitation of the sealed housing. This is because the cooling air circulates in three other directions with respect to the boards 10.

As technology advances, there is a high demand of installing a plurality of high density boards 10 in the tightly sealed housing, wherein the temperature difference should be controlled within a range of ±1° C. In addition, there is a further demand that an overall size of the sealed housing should be minimized.

SUMMARY OF THE INVENTION

It is an object of the present invention to provide a sealed housing type cooling system which is capable of reducing the length of an air flow passage in the housing in order to keep the temperature difference between the boards 10 within the range of ±1° C. Thus, the size of the housing is not affected by the size of the fans. It is another object of the present invention to provide a sealed housing type cooling system which has access means to perform maintenance works for the tester in two directions, whereas the conventional technology allows such maintenance works through only one direction.

In achieving the above objects, in the present invention, two or more boards 10 are loaded side by side each other so that the cooling air is applied horizontally and equally to the boards, in contrast to the conventional technology wherein the boards are loaded in two vertical layers, top and bottom. As a result, the temperature around the boards 10 can be easily and accurately controlled. The boards 10 are loaded horizontally by means of a board rack 16. A plurality of small sized fans 41 and 42 are provided in the housing to send cooled air in the horizontal direction. The cooled air supplied from the small fans 41 and 42 flows horizontally through the short air flow passage while passing through a heat exchanger 32.

Since the present invention employs the small sized fans 41 and 42, the size of the housing is not affected by the size of the fan unlike the conventional technology. Furthermore, the present invention is able to improve air sealing to prevent air leakage by having an air duct 70 in the housing.

In the present invention, the heat exchanger 32 is located close to sealed doors 91 and 92 wherein the heat exchanger 32 can open/close together with the sealed doors 91 and 92. The maintenance works of a back board 13 and a power source unit 20 can be performed by opening the sealed doors 91 and 92. Thus, it is possible in the present invention to perform the maintenance works through two directions, such as rear and front, whereas the conventional apparatus allows maintenance works in only one direction such as the front of the housing.

BRIEF DESCRIPTION OF THE DRAWINGS

FIG. 1 is the first embodiment of the cooling system of the present invention showing a plan view thereof in FIG. 1A, a front view thereof in FIG. 1B and a rear view thereof in FIG. 1C.

DETAILED DESCRIPTION OF THE PREFERRED EMBODIMENT

Figure 3:
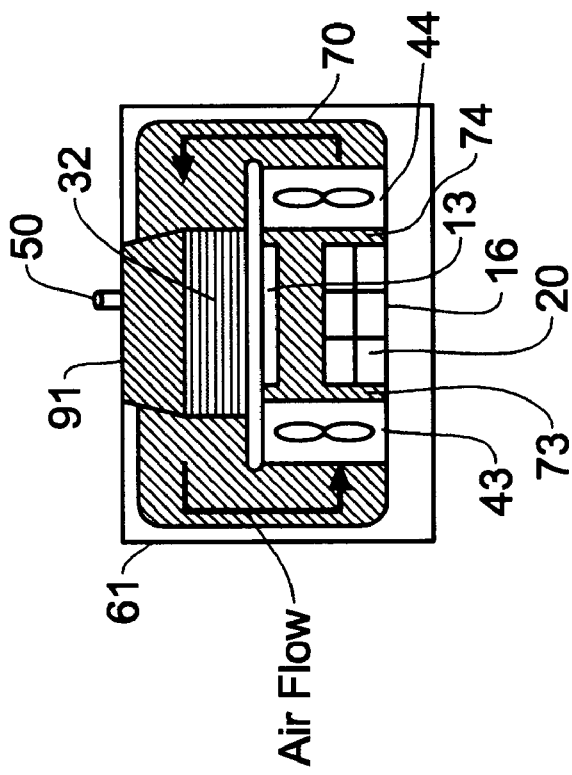
FIG. 3 is a plan view showing the second embodiment of the present invention.

The first embodiment of the present invention is explained with reference to the drawings. The first embodiment is shown in a plan view of FIG. 1A, a front view of FIG. 1B and in a rear view of FIG. 1C.

First, in the front view of FIG. 1B, a board rack 16 is provided in a sealed housing 61 of a cooling apparatus integrated in an IC tester in order to effectively control the temperature of boards 10 having many electric components. The boards 10 are placed horizontally when they are inserted in the board rack 16. A power source unit 20 is provided either on the upper or lower positions, or both positions, in a vertical direction of the board rack 16. Small sized fans 41 and 42 are provided so that the wind therefrom meets the board 10 and the power source unit 20 in the horizontal direction. At about the center of the housing 61, a back board 13 is erected in a vertical direction. In other words, the back board 13 is perpendicular to the floor of the housing 61. The back board 13 may be a circuit board having electric components for forming a part of the tester or may simply be a plain plate of metal or plastic.

The following is the explanation of the plan view of FIG. 1A. The cooling system of the sealed housing type is so structured that the cooling medium circulates in a heat exchanger 32 through a cooling tube 50 which is connected to the exchanger 32. When the small sized fans 41 and 42 begin to send air, the air which passes along an inner wall of the sealed housing 61 cools down the boards 10 and the power source unit 20 (FIG. 1B), and the same air heated during this process passes through the heat exchanger 32 and circulates again in the sealed housing as cooled air.

The back board 13 contributes to promoting such circulation of the air flow in the housing 61 because the back board 13 is positioned about the center of the housing in a manner of FIG. 1A so that the air flow in the direction other than the air flow 13 within the housing 61 is prohibited. The housing of the present invention is an air tight sealed structure so that it is easy to control the temperature in the housing.

The following is the explanation of the rear view of FIG. 1C. The present invention requires only one unit of the heat exchanger 32. However, a plurality of exchangers may be provided separately depending on the design purposes, such as a weight distribution. FIG. 1C shows one example in which two units of heat exchangers 32 such as shown in FIG. 1A are provided, wherein the sealed doors 91 and 92 are provided corresponding to each of the exchangers 32. The sealed doors 91 and 92 are located near the heat exchanger 32, and hinges 80 are provided in the closed housing 61 so that the sealed doors 91 and 92 can be easily opened and closed. Handles 93 and 94 are also provided on the sealed doors 91 and 92. Further, casters 62 are provided as many as necessary for the precise adjustment of the tester position at the bottom of the sealed housing 61.

The second embodiment of the present invention is described in the following with reference to the drawings.

FIG. 3 is a plan view showing the second embodiment. In the sealed housing style cooling apparatus described above, a pair of symmetrical suction-type fans 43 and 44 are provided so that air circulates in one direction in the closed housing, and suction covers 73 and 74 which wrap up the board rack 16 and the power source unit 20 are provided. The suction covers 73 and 74 are arranged in a duct structure so that the air passing through the heat exchanger 32 will not leak out of the boards 10 and the power source unit 20. Since the back board 13 is arranged in the same manner of FIG. 1A, at the center of the air duct 70 in the longitudinal direction of the plan view, the air has to circulate around the back board 13.

The third embodiment of the present invention is described in the following with reference to the drawings.

Figure 2:
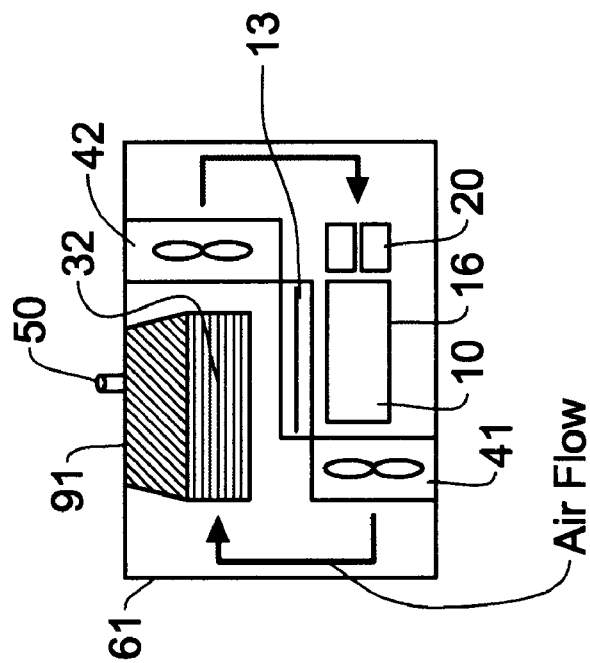
FIG. 2 is a plan view showing the third embodiment of the present invention.
Figure 4B:
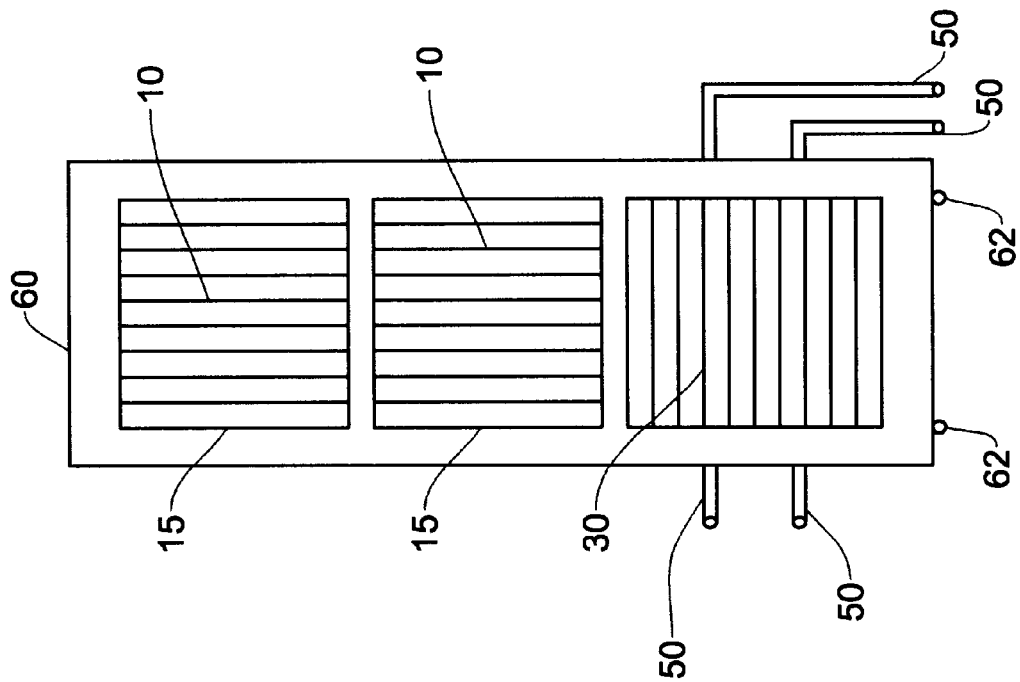
FIG. 4 is the prior art showing a plan view in FIG. 4A), a front view in FIG. 4B and a rear view in FIG. 4C.
Figure 4A:
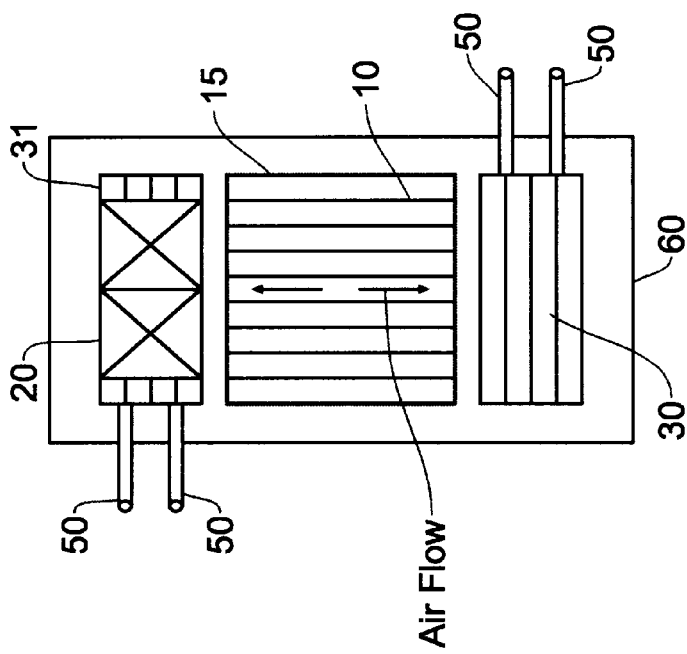
Figure 4C:
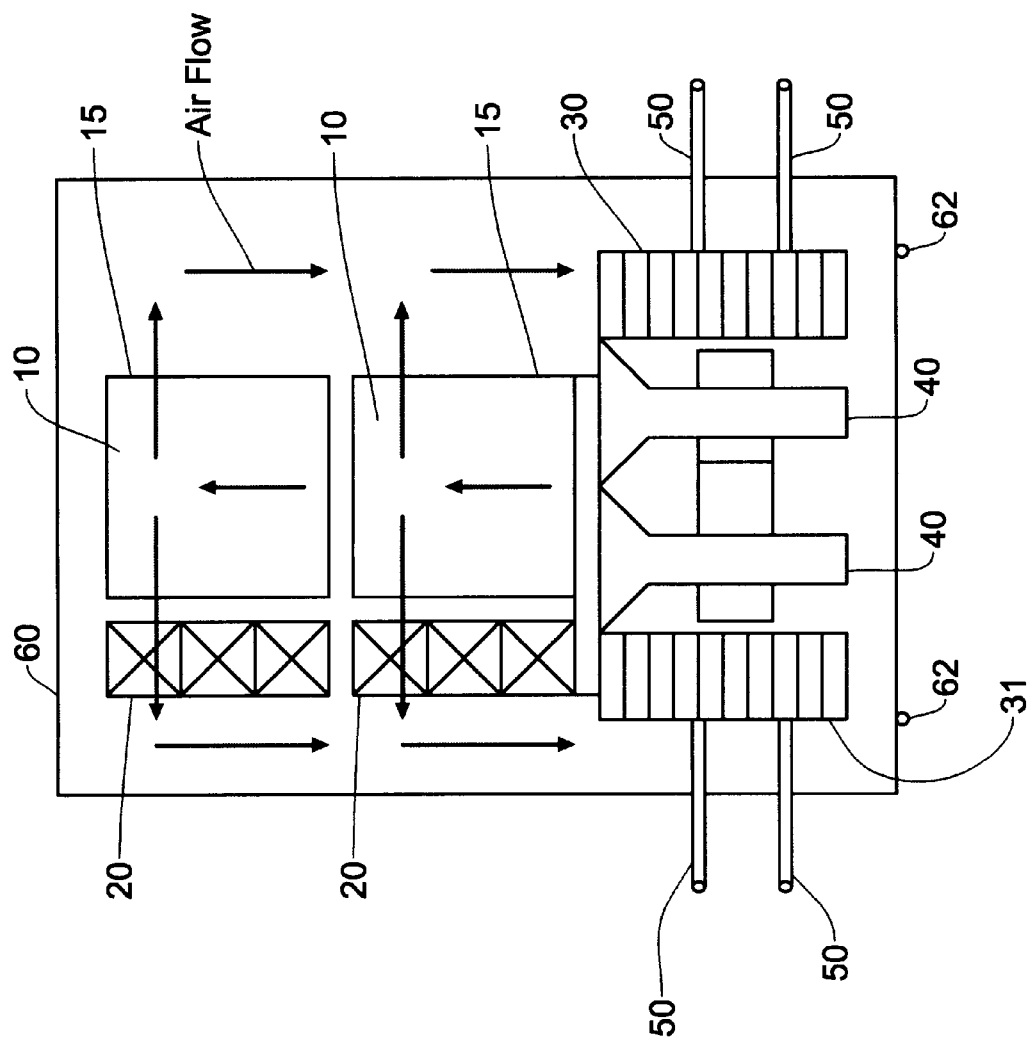

FIG. 2 is a plan view showing the third embodiment. In the third embodiment, the power source units 20 are arranged at the sides of the board rack 16. The power source units 20 may be arranged in one-line or in plural lines. The power source units 20 can be arranged either on the right or left sides of the board rack 16 or may be separately arranged at both sides. The back board 13 is arranged in the same manner of FIG. 1A or FIG. 3, i.e., at the center of the air duct 70 in the longitudinal direction of the plan view. Therefore, the air has to circulate around the back board 13 since the air flow in the up-down direction of the paper of FIG. 2 is prohibited by the back board 13.

The present invention as described in the foregoing achieves the following effects.

In the conventional technology, due to the two-layer structure of the board racks 15, it is a problem that the cooling condition is different between the upper layer and the lower layer of the board racks 15 containing the plural boards 10. In the conventional structure, the air is sent from the lower position to the upper position and the cool air is heated when it passes through the boards 10. For instance, the temperature difference between the upper position and the lower position is as large as 5° C. It is concerned that it may cause adverse effects against the performance of the VLSI and other electric parts loaded on the boards 10. As the technology advances, the density of the electric parts loaded in the boards 10 has been increased. As a result, the dissipation of the heat by the boards will be increased accordingly in the near future which may be disadvantageous.

Therefore, there is a need to keep the temperature difference between the boards 10 within a range of ±1° C. in the sealed housing type cooling system. In the present invention, the boards 10 are placed horizontally in order to minimize the temperature differences. Further, the board rack 16 is provided in order to give the most suitable ventilation to the boards 10. Thus, it becomes much easier to keep the temperature of the board 10 within a range of ±1° C. even when plural boards 10 are located in the sealed housing.

The air passage of the prior art is as long as 5 meters in its periphery, causing the major temperature differences. In the prior art, there was an attempt to solve this problem by providing the large sized fans 40 to eliminate the temperature differences. However, it only resulted another problem of the increased housing size. Furthermore, such large sized fans cause a large space unused in the box.

In the conventional technology, the large sized fans 40 propel air inside the box apparatus. Thus, it causes a problem of the leaking air even though the housing is tightly sealed. Moreover, the conventional technology is associated with another problem in that a connection side of input/output of electric signals is only allowed in one side due to the structural limitation of the sealed housing, whereas cooling air circulates in three directions on the boards 10. Because of the structural limitation, to perform the maintenance work is difficult.

The present invention is constructed in order to shorten the air passage length in the box apparatus, wherein the power source units 20 are loaded on the upper or lower positions of the board rack 16, and the small sized fans 41 and 42 are provided at both side of the board rack 16. Thus, the cooled air flows horizontally toward the boards 10 and power source units 20. In addition, the air duct 70 is provided in the sealed housing 61 for facilitating the horizontal air circulation in the duct 70. As a result, the airtightness is further improved in the sealed housing type cooling system of the present invention.

In the present invention, since the air passage is shortened, the larger sized fans are unnecessary. In fact, the small sized fans 41 and 42 can effectively work for the air circulation. Thus, the small sized fans 41 and 42 of the present invention is able to contribute the to minimized size of the sealed box. Since each of the small sized fans can be arranged in a small space in the box, the inside space of the box is effectively utilized by using many small fans rather than the large fans.

Furthermore, the present invention requires only one unit of the heat exchanger 32 whereas the conventional system requires two units of the heat exchangers 30 and 31. Again, the present invention is able to contribute to the minimized size of the sealed box.

Moreover, for the easier maintenance of the components in the sealed housing 61, the sealed doors 91 and 92 are provided close to the heat exchanger 32. Through the sealed doors 91 and 92, it is possible to perform the routine maintenance works from the different directions, for example, one from the rear and the other from the front, whereas it is restricted in the conventional system wherein it can be accessed only from the front side of the box. When the maintenance is required, the sealed doors 91 and 92 can be opened and closed along with the heat exchanger 32.

What is claimed is:

1. A cooling system for an IC tester, comprising:
    a sealed box forming a sealed housing of said IC tester so that no air flow is allowed between an inside and an outside of the sealed box;
    a back board mounted in said sealed box perpendicular to a bottom surface of said sealed box for controlling air flows in said sealed box, said back board being positioned at around the center of the sealed box in such a way that a continuous air flow passage being formed between said back board and inner walls of said sealed box so that said air flows circulate around said back board;
    a board rack erected in said sealed box and having therein a plurality of circuit boards vertically spaced with each other, said board rack being positioned in said air flow passage at a space between one surface of said back board and a first inner wall of said sealed box;
    a heat exchanger for removing heat from said air flows by having cooling medium flowing therein for transferring said heat to an outside of said sealed box, said heat exchanger being positioned in said air flow passage at a space between another surface of said back board and a second inner wall of said sealed box opposite to said first inner wall; and
    a plurality of fans mounted in said sealed box creating said air flows in a horizontal direction through said heat exchanger and said circuit boards, said air flows circulating around said back board passing through said board rack and said heat exchanger.

2. A cooling system for an IC tester as defined in claim 1, further comprising two or more sealed doors on said sealed box for facilitating maintenance works therethrough for said IC tester.

3. A cooling system for an IC tester as defined in claim 1, further comprising power source units which are positioned above or below said board rack for supplying electric power to circuit boards 10.

4. A cooling system for an IC tester as defined in claim 3, wherein said power source units are positioned either above or below said board rack.

5. A cooling system for an IC tester as defined in claim 3, wherein said power source units are positioned at one side of said board rack.

* * * * *